(12) United States Patent
Kim et al.

(10) Patent No.: US 10,468,627 B2
(45) Date of Patent: Nov. 5, 2019

(54) METHOD OF MANUFACTURING AN ORGANIC LIGHT EMITTING DISPLAY DEVICE HAVING MULTIPLE FILMS

(71) Applicant: Samsung Display Co., Ltd., Yongin-si (KR)

(72) Inventors: Taewoong Kim, Yongin-si (KR);
Hyunwoo Koo, Yongin-si (KR);
Hyungsik Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 22 days.

(21) Appl. No.: 15/837,087

(22) Filed: Dec. 11, 2017

(65) Prior Publication Data
US 2018/0102501 A1  Apr. 12, 2018

Related U.S. Application Data

(60) Division of application No. 15/256,688, filed on Sep. 5, 2016, now Pat. No. 9,871,223, which is a
(Continued)

(30) Foreign Application Priority Data

Mar. 22, 2012 (KR) .................. 10-2012-0029393

(51) Int. Cl.
*H01L 51/00* (2006.01)
*H01L 51/52* (2006.01)
(Continued)

(52) U.S. Cl.
CPC ...... *H01L 51/5253* (2013.01); *H01L 27/3246* (2013.01); *H01L 51/0097* (2013.01);
(Continued)

(58) Field of Classification Search
CPC .................. H01L 51/003; H01L 51/0024
See application file for complete search history.

(56) References Cited

U.S. PATENT DOCUMENTS 7,652,291 B2   1/2010 Koo et al.
7,875,895 B2   1/2011 Kwack et al.
(Continued)

FOREIGN PATENT DOCUMENTS

JP   2001-142412   5/2001
KR   2003-0036005  5/2003
(Continued)

OTHER PUBLICATIONS

Notification of Reason for Refusal dated Mar. 21, 2018, issued in Korean Patent Application No. 10-2012-0029393.
(Continued)

*Primary Examiner* — Thomas L Dickey
(74) *Attorney, Agent, or Firm* — H.C. Park & Associates, PLC

(57) ABSTRACT

A method of manufacturing an organic light emitting display device, including: forming a first film of an organic material, and having first and second surfaces facing each other and a third surface perpendicular to the first and second surfaces; forming a second film on the first film to cover the second and third surfaces of the first film; forming an organic light emitting unit on the second film; forming a third film on the second film to cover the organic light emitting unit; forming a fourth film of an organic material on the third film and having fourth and fifth surfaces facing each other and the fifth surface facing the third film; combining the second support substrate and the first support substrate such that the fifth surface faces the third film; detaching the second support substrate from the fourth surface; and detaching the first support substrate from the first surface.

9 Claims, 5 Drawing Sheets

Related U.S. Application Data continuation of application No. 13/609,439, filed on Sep. 11, 2012, now Pat. No. 9,437,829.

(51) Int. Cl.
*H01L 27/32* (2006.01)
*H01L 51/50* (2006.01)
*H01L 51/56* (2006.01)

(52) U.S. Cl.
CPC ........ *H01L 51/5012* (2013.01); *H01L 51/524* (2013.01); *H01L 51/5206* (2013.01); *H01L 51/5221* (2013.01); *H01L 51/5246* (2013.01); *H01L 51/56* (2013.01); *H01L 2251/5338* (2013.01); *Y02E 10/549* (2013.01); *Y02P 70/521* (2015.11)

(56) References Cited

U.S. PATENT DOCUMENTS

| | | | |
|---|---|---|---|
| 8,030,841 B2 | 10/2011 | Kwack et al. | |
| 8,466,456 B2 | 6/2013 | Kim et al. | |
| 8,481,992 B2 | 7/2013 | Kho et al. | |
| 8,492,754 B2 | 7/2013 | Nishiyama et al. | |
| 8,574,662 B2 | 11/2013 | Lee | |
| 9,437,829 B2 | 9/2016 | Kim et al. | |
| 2003/0082889 A1 | 5/2003 | Maruyama et al. | |
| 2005/0104516 A1 | 5/2005 | Park et al. | |
| 2008/0176476 A1 | 7/2008 | Huang et al. | |
| 2008/0284971 A1 | 11/2008 | Park et al. | |
| 2010/0181903 A1 | 7/2010 | Kim et al. | |
| 2011/0156062 A1* | 6/2011 | Kim .................... | H01L 51/0097 257/88 |
| 2011/0291117 A1* | 12/2011 | Kwack ................ | H01L 51/5246 257/88 |
| 2012/0068162 A1 | 3/2012 | Mandlik et al. | |

FOREIGN PATENT DOCUMENTS

| | | |
|---|---|---|
| KR | 10-2004-0070976 | 8/2004 |
| KR | 10-2005-0046922 | 5/2005 |
| KR | 10-2009-0112387 | 10/2009 |
| KR | 10-2010-0085347 | 9/2010 |
| KR | 10-0982498 | 9/2010 |

OTHER PUBLICATIONS

Non-Final Office Action dated Mar. 10, 2017, in U.S. Appl. No. 15/256,688.

Notice of Allowance dated Sep. 11, 2017, in U.S. Appl. No. 15/256,688.

\* cited by examiner

METHOD OF MANUFACTURING AN ORGANIC LIGHT EMITTING DISPLAY DEVICE HAVING MULTIPLE FILMS

CROSS-REFERENCE TO RELATED APPLICATIONS

This application is a Divisional of U.S. patent application Ser. No. 15/256,688, filed on Sep. 5, 2016, which is a Continuation of U.S. patent application Ser. No. 13/609,439, filed on Sep. 11, 2012, now issued as U.S. Pat. No. 9,437,829, and claims priority from and the benefit of Korean Patent Application No. 10-2012-0029393, filed on Mar. 22, 2012, each of which is hereby incorporated by reference for all purposes as if fully set forth herein.

BACKGROUND

Field

The present invention relates to an organic light emitting display device and a method of manufacturing the same, and more particularly, to an organic light emitting display device capable of preventing permeation of moisture, and a method of manufacturing the same.

Discussion of the Background

Since an organic light emitting display device has excellent characteristics in terms of viewing angle, contrast, response speed, and power consumption, application ranges of the organic light emitting display device are being increased from a personal portable device, such as an MP3 player or a mobile phone, to a television (TV).

Also, the organic light emitting display device has a self-emitting characteristic, and has a thin thickness and light weight unlike a liquid crystal display device, since the organic light emitting display device does not require a separate light source.

Such an organic light emitting display device may be flexible by using a plastic substrate. However, moisture permeability of the plastic substrate is too high, and thus a lifetime of the organic light emitting display device may be decreased.

SUMMARY

According to an aspect of the present invention, there is provided an organic light emitting display device including: a first film formed of an organic material, and having first and second surfaces facing each other and a third surface perpendicular to the first and second surfaces; a second film formed on the first film to cover the second and third surfaces of the first film; an organic light emitting unit disposed on the second film; a third film disposed on the second film and covering the organic light emitting unit; and a fourth film disposed on the third film, formed of an organic material, and having fourth and fifth surfaces facing each other, wherein the fifth surface faces the third film.

The organic light emitting display device may further include a side barrier disposed on the second film and surrounding the organic light emitting unit.

The side barrier may contact at least a side surface of the third film.

The side barrier may include a hybrid polymer.

The side barrier may form a closed loop.

The organic light emitting display device may further include a fifth film disposed between the fifth surface of the fourth film and the third film. The fifth film may include an inorganic layer.

The third film may include an adhesive.

The organic light emitting display device may further include a barrier being disposed between the third film and the organic light emitting unit to cover the organic light emitting unit.

According to another aspect of the present invention, there is provided a method of manufacturing an organic light emitting display device, the method including: forming a first film on a first support substrate where the first film includes an organic material, the first film having first and second surfaces facing each other and a third surface perpendicular to the first and second surfaces such that the first surface faces the first support substrate; forming a second film on the first film to cover the second and third surfaces of the first film; forming an organic light emitting unit on the second film; forming a third film on the second film to cover the organic light emitting unit; forming a fourth film on a second support substrate where the fourth film includes an organic material, the fourth film having fourth and fifth surfaces facing each other, such that the fourth surface faces the second support substrate; combining the second support substrate to the first support substrate such that the fifth surface faces the third film; detaching the second support substrate from the fourth surface; and detaching the first support substrate from the first surface.

The method may further include forming a side barrier on the second film to surround the organic light emitting unit.

The side barrier may be formed to contact at least a side surface of the third film.

The side barrier may include a hybrid polymer.

The side barrier may form a closed loop.

The method may further include forming a fifth film on the fifth surface of the fourth film. The fifth film may include an inorganic layer.

The third film may include an adhesive.

The method may further include forming a barrier on the organic light emitting unit to cover the organic light emitting unit.

The method may further include forming a de-bonding layer on a region of the second support substrate such that the region where the de-bonding layer is formed has a wider area than a region corresponding to the organic light emitting unit, wherein the detaching of the second support substrate from the fourth surface may include applying a laser beam on a region outside the region where the de-bonding layer is formed.

The method may further include forming a de-bonding layer on a region of the first support substrate such that the region where the de-bonding layer is formed has a wider area than a region corresponding to the organic light emitting unit, wherein the detaching of the first support substrate from the first surface may include applying a laser beam on a region outside the region where the de-bonding layer is formed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings, in which exemplary embodiments of the invention are shown.

As used herein, the term "and/or" includes any and all combinations of one or more of the associated listed items.

Figure 1:
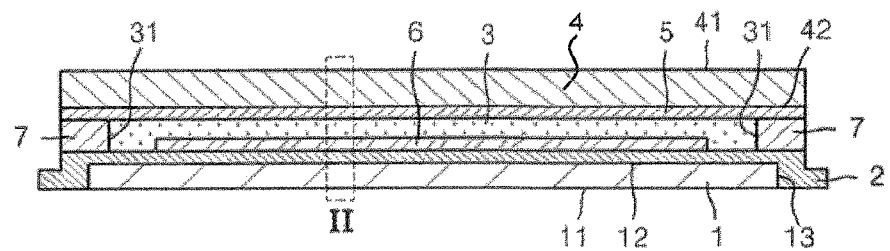
FIG. 1 is a cross-sectional view of an organic light emitting display device according to an embodiment of the present invention.
Figure 2:
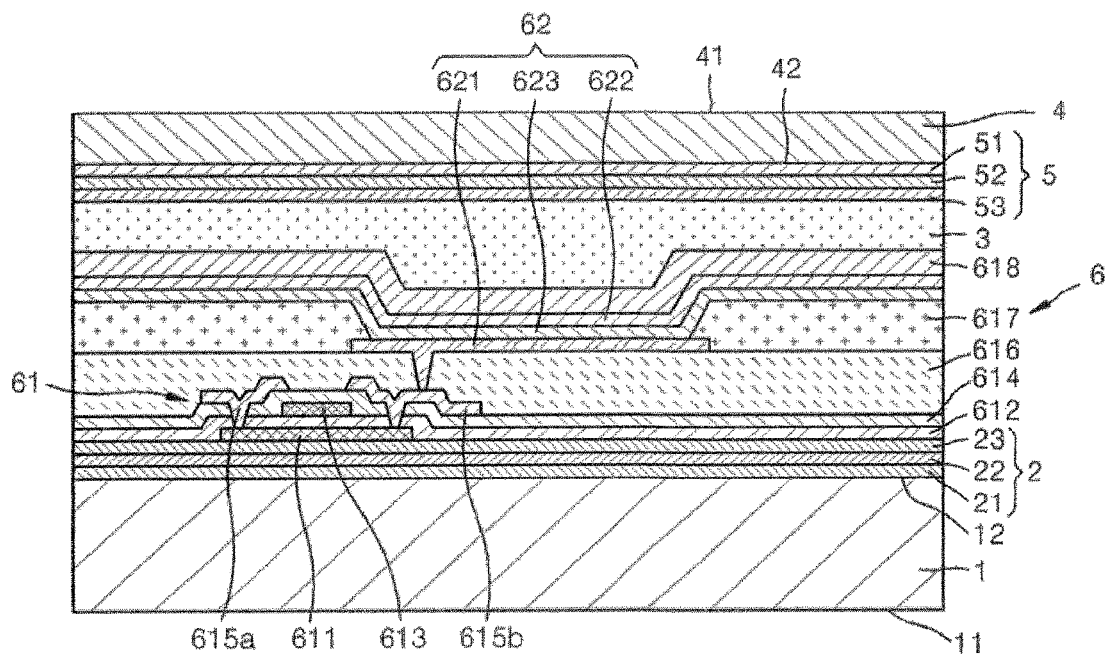
FIG. 2 is a partial magnified cross-sectional view of a region II of FIG. 1.

FIG. 1 is a cross-sectional view of an organic light emitting display device according to an embodiment of the present invention, and FIG. 2 is a partial magnified cross-sectional view of a region II of FIG. 1.

The organic light emitting display device according to the current embodiment includes a first film 1, a second film 2, a third film 3, a fourth film 4, and an organic light emitting unit 6.

The first film 1 is formed of an organic material, and may be a transparent or opaque plastic film. For example, the first film 1 may be formed of polyimide, i.e., a high thermal resistant organic material usable even at 500° C.

The first film 1 includes a first surface 11 and a second surface 12 facing each other. Also, the first film 1 includes a third surface 13 perpendicular to the first and second surfaces 11 and 12. Referring to FIG. 1, the first surface 11 is a bottom surface, the second surface 12 is a top surface, and the third surface 13 is a side surface.

The second film 2 is formed on the first film 1 such as to cover the second and third surfaces 12 and 13 of the first film 1. Accordingly, the first surface 11 of the first film 1 is not covered by the second film 2 and is exposed. The second film 2 includes inorganic and organic materials to perform a barrier function on the first film 1.

The organic light emitting unit 6 is formed on the second film 2.

The third film 3 is disposed on the second film 2 such as to cover the organic light emitting unit 6. The third film 3 may include an adhesive, such as a pressure sensitive adhesive. Alternatively, the third film 3 may use a two-sided adhesive tape including a pressure sensitive adhesive.

Also, the fourth film 4 is disposed on the third film 3. The fourth film 4 is formed of an organic material, and may be a transparent or opaque plastic film. For example, the fourth film 4 may be formed of polyimide.

The fourth film 4 has a fourth surface 41 and a fifth surface 42 facing each other, wherein the fifth surface 42 is disposed to face the third film 3.

According to such a structure, the first film 1 constituting a lower substrate not only has the second surface 12 facing the organic light emitting unit 6 but also the third surface 13 constituting a side, which are covered by the second film 2, and thus permeation of oxygen and moisture to the first film 1 may be effectively prevented.

Meanwhile, a fifth film 5 may be further disposed between the fifth surface 42 of the fourth film 4 and the third film 3.

The fifth film 5 includes inorganic and organic materials, thereby preventing moisture permeation and air permeation into the organic light emitting unit 6 through the fourth film 4.

Also, a side barrier 7 may be further formed on the second film 2 to surround the organic light emitting unit 6.

The side barrier 7 may contact a side surface 31 of the third film 3, and the side barrier 7 may prevent moisture permeation and air permeation from the side surface 31 of the third film 3 to the organic light emitting unit 6.

Figure 3:
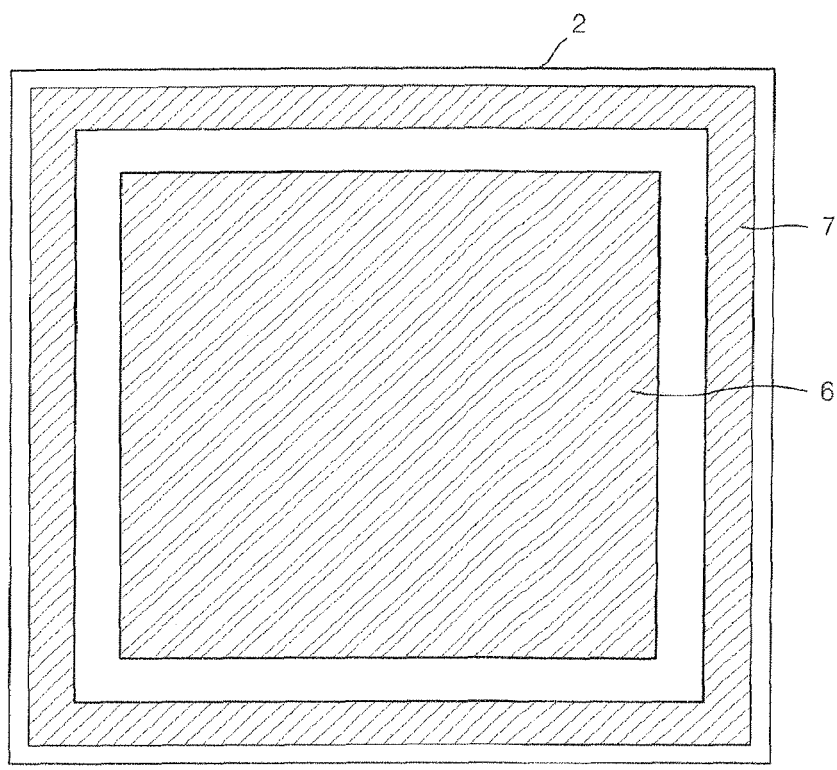
FIG. 3 is a plan view of the organic light emitting display device of FIG. 1.

As shown in FIG. 3, the side barrier 7 may surround the organic light emitting unit 6 in a closed loop shape.

Also, the side barrier 7 may include a hybrid polymer, such as a hybrid organic/inorganic polymer, and in detail, an organosiloxane-based hybrid organic/inorganic polymer. The side barrier 7 may be formed of a compound containing methyltriethoxysilane and tetraethylorthosilicate.

The organic light emitting display device according to an embodiment of the present invention will now be described in detail with reference to FIG. 2.

First, the second film 2 formed on the second surface 12 of the first film 1 may have a structure, in which a layer formed of an inorganic material and a layer formed of an organic material are alternately stacked in the form of multi-layers. For example, the second film 2 may be formed on the second surface 12 of the first film 1 in a structure wherein a first layer 21, a second layer 22, and a third layer 23 are sequentially stacked on each other. Here, the first and third layers 21 and 23 may include an inorganic material, such as silicon nitride, silicon oxide, or aluminum oxide, and the second layer 22 may include an organic material, such as polyacrylate. Alternatively, the first and third layers 21 and 23 may include an organic material, and the second layer 22 may include an inorganic material. Alternatively, the first through third layers 21 through 23 may be formed of different type of inorganic materials. The second film 2 may include a single or multiple inorganic material layers.

The organic light emitting unit 6 is formed on the third layer 23. The organic light emitting unit 6 includes a pixel circuit unit including a thin film transistor 61, and an organic light emitting diode 62 from which light is emitted.

According to an embodiment of the present invention referring to FIG. 2, the thin film transistor 61 is formed on the third layer 23. Although not shown, a plurality of the thin film transistors 61 may be formed in one pixel, and a capacitor (not shown) may be simultaneously formed while forming the thin film transistor 61.

The thin film transistor 61 includes a semiconductor active layer 611 formed on the third layer 23.

The semiconductor active layer 611 may be formed of amorphous or polycrystalline silicon, but is not limited thereto, and may be formed of a semiconductor oxide. For example, the semiconductor active layer 611 may be a G-I-Z-O layer or a($In_2O_3$)b($Ga_2O_3$)c(ZnO) layer, wherein a, b, and c are real numbers satisfying a≥0, b≥0, and c>0.

A gate insulation film 612 is formed on the third layer 23 such as to cover the semiconductor active layer 611, and a gate electrode 613 is formed on the gate insulation film 612.

An interlayer insulation film 614 is formed on the gate insulation film 612 such as to cover the gate electrode 613, and a source electrode 615a and a drain electrode 615b may be formed on the interlayer insulation film 614 to contact the semiconductor active layer 611 through contact holes, respectively.

The structure of the thin film transistor 61 is not limited to the above, and one of various structures of a thin film transistor may be applied.

A planarization film 616 may be formed to cover the thin film transistor 61. The planarization film 616 may be a single or multiple layers wherein a top surface is planate. The planarization film 616 may be formed of an inorganic material and/or an organic material.

A pixel electrode 621 is formed on the planarization film 616, and the pixel electrode 621 is connected to the drain electrode 615b of the thin film transistor 61 through a via hole formed on the planarization film 616.

A pixel defining film 617 is formed on the planarization film 616 such as to cover edges of the pixel electrode 621. An organic light emitting layer 623 and a counter electrode 622 are sequentially stacked on the pixel electrode 621. The counter electrode 622 may be a common electrode throughout all pixels.

The organic light emitting layer 623 may be a low molecular or high molecular organic film. When the low molecular organic film is used, a hole injection layer (HIL), a hole transport layer (HTL), an emission layer (EML), an electron transport layer (ETL), and an electron injection layer (EIL) may be stacked on each other in a single or multiple structure, and organic materials, such as copper phthalocyanine (CuPc), N,N'-Di(naphthalene-1-yl)-N,N'-diphenyl-benzidine (NPB), or tris-8-hydroxyquinoline aluminum (Alq3), may be used. The low molecular organic film may be formed via a vacuum deposition method. Here, the HIL, the HTL, the ETL, and the HIL may be commonly applied to red, green, and blue pixels as a common layer.

The pixel electrode 621 may function as an anode, and the counter electrode 622 may function as a cathode. Of course, polarities of the pixel electrode 621 and counter electrode 622 may be changed.

In a top-emission type where an image is realized towards the counter electrode 622, the pixel electrode 621 may be a reflective electrode and the counter electrode 622 may be a transparent electrode. Here, the pixel electrode 621 may include a reflection film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound thereof, and indium tin oxide (ITO), indium zinc oxide (IZO), zinc oxide (ZnO), or indium oxide (In2O3), which have a high work function. Also, the counter electrode 622 may be a thin film formed of a metal having a low work function, such as Ag, Mg, Al, Pt, Pd, Au, Ni, Nd, Ir, Cr, Li, or Ca, so as to be a semi-transmission reflective film.

In a bottom-emission type wherein an image is realized towards the pixel electrode 621, the pixel electrode 621 may be a transparent electrode and the counter electrode 622 may be a reflective electrode. Here, the pixel electrode 621 may include ITO, IZO, ZnO, or In2O3, and the counter electrode 622 may include Ag, Mg, Al, Pt, Pd, Au, Ni, Nd, Ir, Cr, Li, or Ca.

In a dual-type wherein an image is realized towards both of the pixel electrode 621 and the counter electrode 622, the pixel electrode 621 and the counter electrode 622 may be transparent electrodes.

A barrier 618 may be formed on the counter electrode 622. The barrier 618 may be formed of an organic material and/or an inorganic material, such as polyacrylate and/or aluminum oxide.

The third film 3 is disposed on the barrier 618, and the fourth film 4 is disposed on the third film 3.

The fourth film 4 may include a thermal resistant organic material, such as polyimide.

The fifth film 5 may be formed on the fifth surface 42 of the fourth film 4. The fifth film 5 may have a structure, in which a layer formed of an inorganic material and a layer formed of an organic material are alternately stacked in the form of multi-layers. For example, the fifth film 5 may have a structure, in which a fourth layer 51, a fifth layer 52, and a sixth layer 53 are sequentially stacked on the fifth surface 42 of the fourth film 4. Here, the fourth and sixth layers 51 and 53 may be formed of an inorganic material, such as silicon nitride, silicon oxide, or aluminum oxide, and the fifth layer 52 may be formed of an organic material, such as polyacrylate. Alternatively, the fourth and sixth layers 51 and 53 may be formed of an organic material, and the fifth layer 52 may be formed of an inorganic material. Alternatively, the fourth through sixth layers 51 through 53 may be formed of different types of inorganic materials. The fourth film 4 may include a single or multiple inorganic material layers. In FIG. 2, the fifth film 5 is disposed between the third film 3 and the fourth film 4.

Next, a method of manufacturing the organic light emitting display device will be described.

Figure 4:
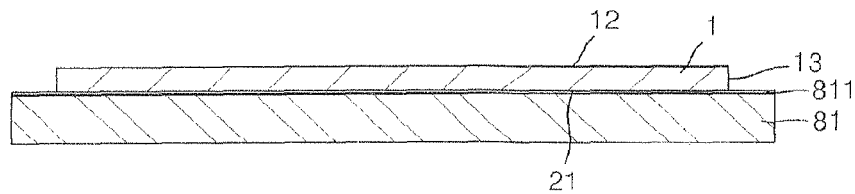
FIGS. 4 through 12 are cross-sectional views for describing a method of manufacturing the organic light emitting display device of FIG. 1.

First, as shown in FIG. 4, the first film 1 is formed on a first support substrate 81. The first support substrate 81 enables the first film 1 to be easily handled, and may be a transparent glass substrate.

The first film 1 may be formed by coating the first support substrate 81 with an organic material, and then by hardening the organic material formed on the first support substrate 81. The first film 1 may be formed of high thermal resistant polyimide usable even at 500° C.

A first combination layer 811 may be further disposed between the first support substrate 81 and the first film 1. As described below, the first combination layer 811 enables the first support substrate 81 and the first film 1 to be easily detached from each other upon being exposed to a laser beam. The first combination layer 811 may be formed of amorphous silicon that may generate a phase change by a laser beam, but is not limited thereto. Also, the first combination layer 811 may not be included.

When the first combination layer 811 is formed on the first support substrate 81, the first film 1 is formed on the first combination layer 811. Accordingly, the first surface 11 of the first film 1 contacts the first combination layer 811.

As shown in FIG. 4, the first film 1 may have a smaller area than the first support substrate 81.

Figure 5:
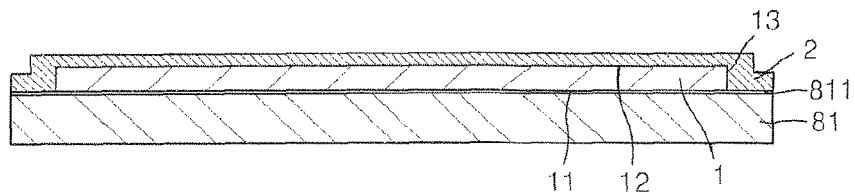

Next, as shown in FIG. 5, the second film 2 is formed on the first support substrate 81 such as to cover the second and third surfaces 12 and 13 of the first film 1. When the first combination layer 811 is formed on the first support substrate 81, the second film 2 is formed on the first combination layer 811. As shown in FIG. 2, the second film 2 may include an inorganic material layer.

Here, the inorganic material layer may be formed of an aluminum oxide film using an ALD or CVD device at a high temperature, or multiple films of silicon nitride/silicon oxide.

As such, by forming the first film 1 using high thermal resistant polyimide and forming the inorganic material layer of the second film 2 at a high temperature, a denser inorganic material layer may be formed, thereby increasing moisture and oxygen blocking characteristics of the second film 2.

Figure 6:
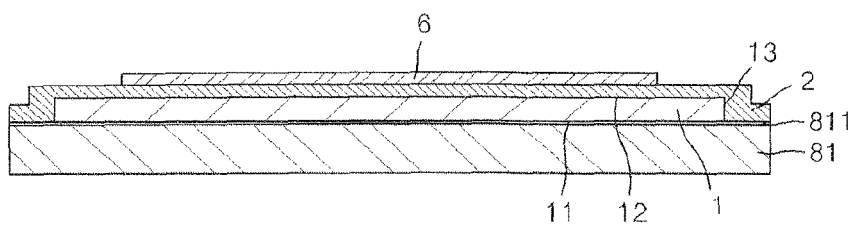

Next, as shown in FIG. 6, the organic light emitting unit 6 is formed on the second film 2.

Figure 7:
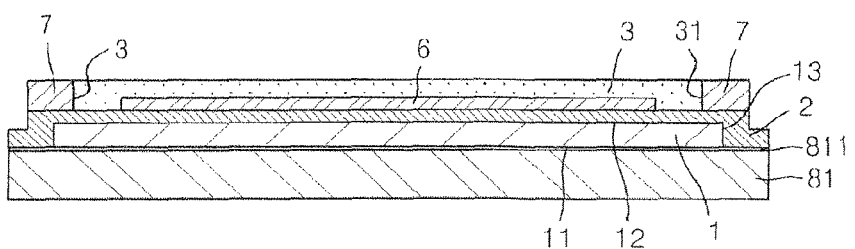

Then, as shown in FIG. 7, the side barrier 7 and the third film 3 are formed on the second film 2. The third film 3 may be disposed to be surrounded by the side barrier 7. Accordingly, the side surface 31 of the third film 3 may contact the side barrier 7.

The side barrier 7 may include a hybrid polymer having excellent barrier characteristics, such as a hybrid organic/inorganic polymer, for example, an organosiloxane-based hybrid organic/inorganic polymer. Alternatively, the side barrier 7 may be formed of a compound containing methyltriethoxysilane and tetraethylorthosilicate. The side barrier 7 may be hardened via heat or a laser beam.

Accordingly, the side barrier 7 may block moisture and oxygen permeation from the side surface 31 of the third film 3 including the adhesive.

When such a structure is applied to a device having a large screen area such as a television (TV), a width of the side barrier 7 may be increased due to a margin at edges of a screen, and thus barrier characteristics may be further improved.

Figure 8:
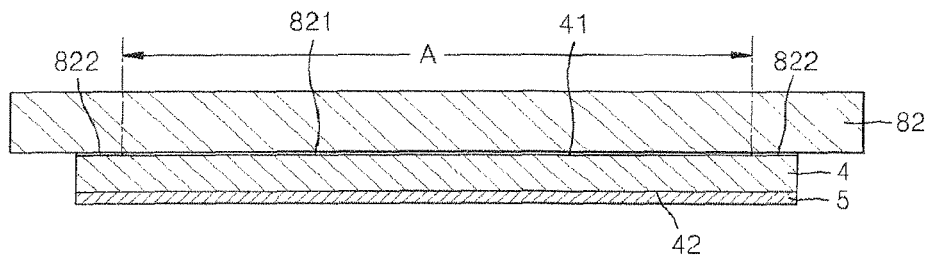

Meanwhile, as shown in FIG. 8, a second support substrate 82 is prepared. The second support substrate 82 functions as a support for handling of the fourth film 4, and may be a transparent glass substrate.

The fourth film 4 may be formed by coating the second support substrate 82 with an organic material, and by hardening the organic material formed on the second support substrate 82.

As shown in FIG. 8, a de-bonding layer 821 is further disposed between the second support substrate 82 and the fourth film 4. The de-bonding layer 821 is formed in a region A of the second support substrate 82, wherein an area of the region A is larger than an area of a region corresponding to the organic light emitting unit 6 as described below. In the region A wherein the de-bonding layer 821 is formed, the second support substrate 82 and the fourth film 4 are not attached to each other, or are easily de-bonded without a laser beam irradiation due to the de-bonding layer 821. The de-bonding layer 821 may be formed by surface-treating the second support substrate 82.

A second combination layer 822 may be further disposed between the second support substrate 82 and the fourth film 4 outside the region A where the de-bonding layer 821 is formed. As described below, the second combination layer 822 enables the second support substrate 82 and the fourth film 4 to be easily detached from each other upon being exposed to a laser beam. The second combination layer 822 may be formed of amorphous silicon that may generate a phase change by a laser beam, but is not limited thereto. Also, the second combination layer 822 may not be included.

According to such a structure, the fourth film 4 is combined to the second support substrate 82 in a region where the second combination layer 822 is formed, and the fourth film 4 and the second support substrate 82 are detached from each other by irradiating the second combination layer 822 with a laser beam.

The fourth film 4 is formed on the second combination layer 822 and the de-bonding layer 821. Accordingly, the fourth surface 41 of the fourth film 4 contacts the second combination layer 822 and the de-bonding layer 821.

Then, the fifth film 5 is formed on the fifth surface 42 of the fourth film 4.

As shown in FIG. 2, the fifth film 5 may include an inorganic material layer.

Here, the inorganic material layer may be formed of an aluminum oxide film by using an ALD or CVD device at a high temperature, or a multiple films of silicon nitride/silicon oxide.

By forming the fourth film 4 using high thermal resistant polyimide and forming the inorganic material layer of the fifth film 5 at a high temperature, a denser inorganic material layer may be formed, thereby increasing moisture and oxygen blocking characteristics of the fifth film 5.

Figure 9:
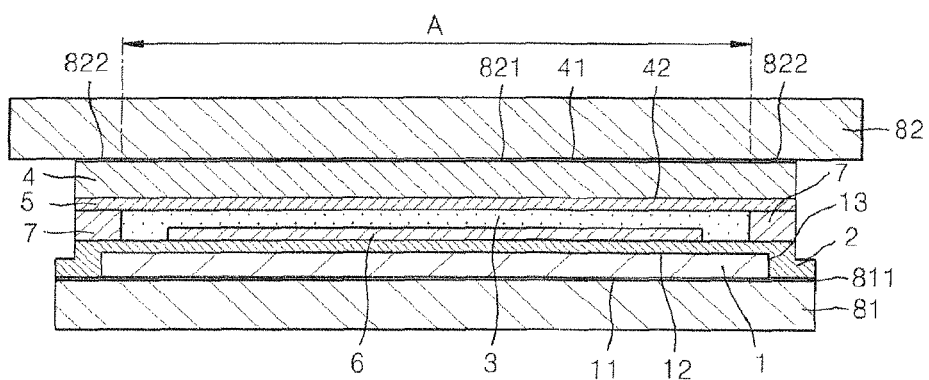

Next, as shown in FIG. 9, the film structure built on the second support substrate 82 and the film structure built on the first support substrate 81 are combined to each other. Here, the fifth film 5 contacts the third film 3 and the side barrier 7, and then is pressed such that the fifth film 5 is combined to the third film 3.

Alternatively, the side barrier 7 may be formed after the third and fifth films 3 and 5 are combined to each other.

Figure 10:
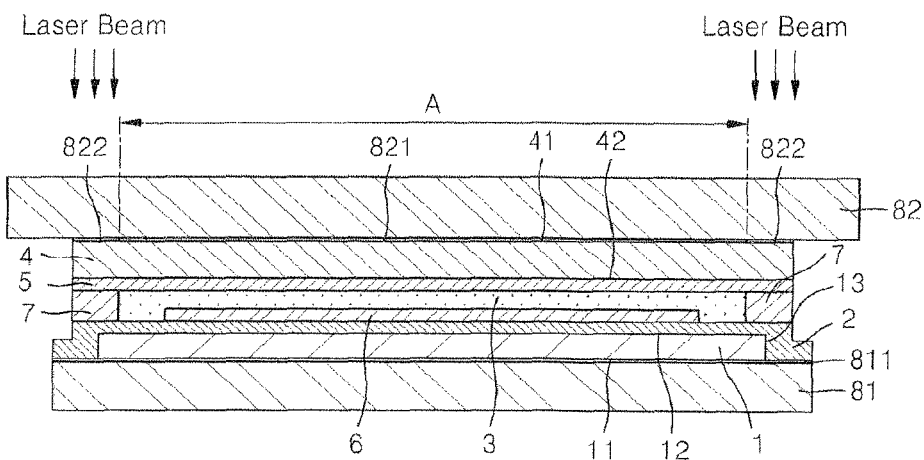
Figure 11:
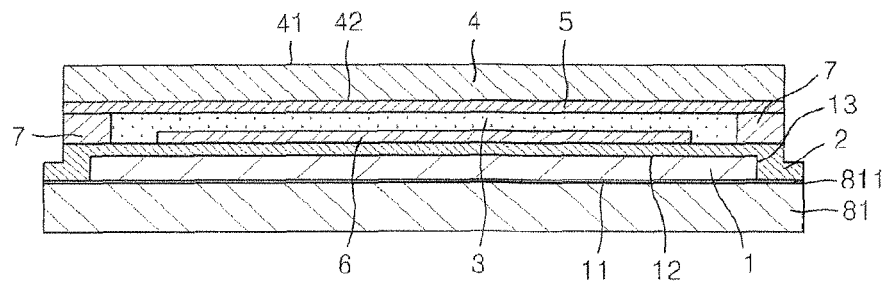

Then, as shown in FIG. 10, a laser beam is applied from outside the second support substrate 82. Here, the laser beam is applied to the second combination layer 822 outside the region A where the de-bonding layer 821 is formed. Thereby, the second support substrate 82 and the fourth film 4 are detached from each other, as shown in FIG. 11, through a phase change of the second combination layer 822. By not applying the laser beam to the region A where the de-bonding layer 821 is formed, the organic light emitting unit 6 is prevented from being exposed to the laser beam, and thus the organic light emitting unit 6 is prevented from deteriorating by the laser beam. Alternatively, the laser beam may be applied only on the second combination layer 822, and at this time, the side barrier 7 may be simultaneously hardened.

Figure 12:
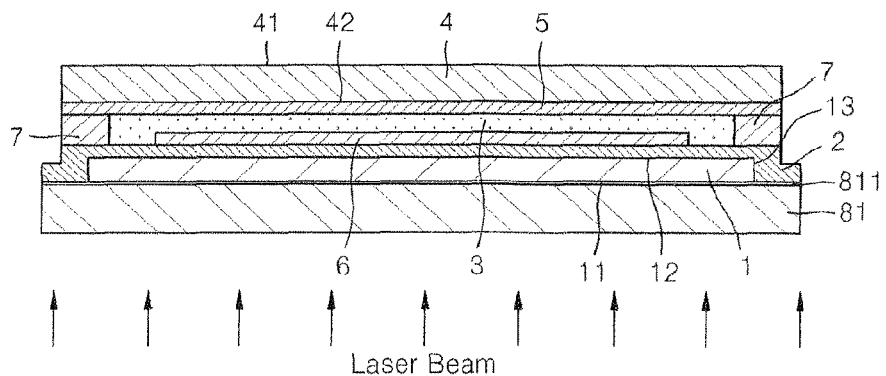

Then, as shown in FIG. 12, a laser beam is applied from outside the first support substrate 81 so that the first support substrate 81 is detached from the first and second films 1 and 2 by a phase change of the first combination layer 811.

Here, as shown in FIG. 2, since a circuit unit including the thin film transistor 61 is formed below the organic light emitting unit 6 formed on the second film 2, an adverse effect to the organic light emitting diode 62 may be reduced even if a laser beam is irradiated in general from the bottom of the first support substrate 81.

Figure 13:
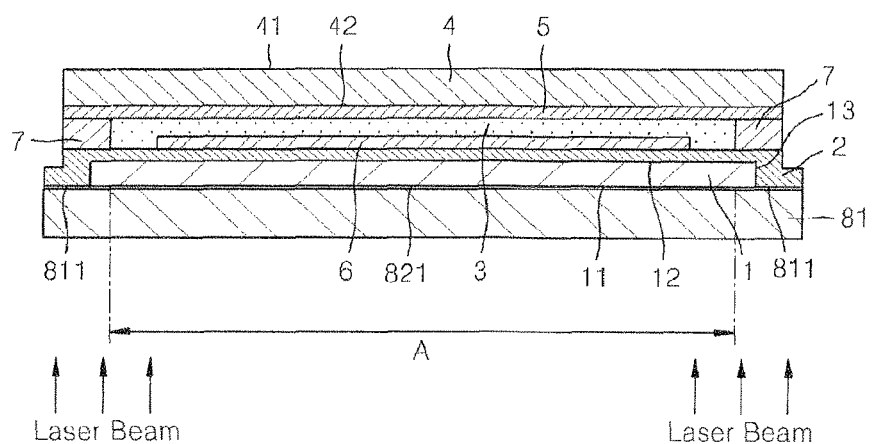
FIG. 13 is a cross-sectional view illustrating another example of FIG. 12.

However, alternatively as shown in FIG. 13, the de-bonding layer 821 may be also formed on the first support substrate 81 in the region A, which is larger than the region corresponding to the organic light emitting unit 6, and the first combination layer 811 may be formed outside the de-bonding layer 821, thereby separating the first support substrate 81 from the first and second films 1 and 2 by applying a laser beam only to the first combination layer 811 outside the de-bonding layer 821. Here, since a laser beam is blocked from being applied to the organic light emitting unit 6, quality of the organic light emitting unit 6 may be further improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting display device, the method comprising:
   forming a first film on a first support substrate, the first film including an organic material, the first film having first and second surfaces facing each other and a third surface perpendicular to the first and second surfaces, the first surface facing the first support substrate;
   forming a second film on the first film to cover the second and third surfaces of the first film;
   forming an organic light emitting unit on the second film;
   forming a barrier on the organic light emitting unit to cover the organic light emitting unit;

forming a third film on the second film, the third film covering the organic light emitting unit;

forming a fourth film on a second support substrate, the fourth film including an organic material, the fourth film having fourth and fifth surfaces facing each other, the fourth surface facing the second support substrate;

combining the second support substrate to the first support substrate such that the fifth surface faces the third film;

detaching the second support substrate from the fourth surface; and detaching the first support substrate from the first surface.

2. The method of claim 1, further comprising forming a side barrier on the second film to surround the organic light emitting unit.

3. The method of claim 2, wherein the side barrier is formed to contact at least a side surface of the third film.

4. The method of claim 2, wherein the side barrier comprises a hybrid polymer.

5. The method of claim 1, wherein the side barrier forms a closed loop.

6. The method of claim 1, further comprising forming a fifth film on the fifth surface of the fourth film, the fifth film comprising an inorganic layer.

7. The method of claim 1, wherein the third film comprises an adhesive.

8. The method of claim 1, further comprising forming a de-bonding layer on a region of the second support substrate such that the region where the de-bonding layer is formed has a wider area than a region corresponding to the organic light emitting unit, wherein the detaching of the second support substrate from the fourth surface comprises applying a laser beam on a region outside the region where the de-bonding layer is formed.

9. The method of claim 1, further comprising forming a de-bonding layer on a region of the first support substrate such that the region where the de-bonding layer is formed has a wider area than a region corresponding to the organic light emitting unit, wherein the detaching of the first support substrate from the first surface comprises applying a laser beam on a region outside the region where the de-bonding layer is formed.

* * * * *